(12) United States Patent
Liu et al.

(10) Patent No.: US 8,462,544 B2
(45) Date of Patent: *Jun. 11, 2013

(54) SPIN CURRENT GENERATOR FOR STT-MRAM OR OTHER SPINTRONICS APPLICATIONS

(75) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/555,940

(22) Filed: Jul. 23, 2012

(65) Prior Publication Data

US 2012/0287704 A1 Nov. 15, 2012

Related U.S. Application Data

(63) Continuation of application No. 13/012,661, filed on Jan. 24, 2011, now Pat. No. 8,228,717, which is a continuation of application No. 12/242,228, filed on Sep. 30, 2008, now Pat. No. 7,876,603.

(51) Int. Cl.
*G11C 11/00* (2006.01)

(52) U.S. Cl.
USPC .................... 365/158; 365/148; 365/171

(58) Field of Classification Search
USPC ............. 365/148, 158, 171, 173; 360/313, 360/324, 324.2
See application file for complete search history.

(56) References Cited

U.S. PATENT DOCUMENTS

| | | | |
|---|---|---|---|
| 6,424,563 B2 | 7/2002 | Honigschmid | |
| 6,490,217 B1 | 12/2002 | DeBrosse et al. | |
| 6,704,250 B1 * | 3/2004 | Ueyanagi | 369/13.33 |
| 6,847,547 B2 | 1/2005 | Albert et al. | |
| 6,896,975 B2 | 5/2005 | Lin et al. | |
| 6,982,916 B2 | 1/2006 | Tsang | |
| 6,992,359 B2 | 1/2006 | Nguyen et al. | |
| 7,009,877 B1 | 3/2006 | Huai et al. | |
| 7,042,762 B2 | 5/2006 | Nakamura et al. | |
| 7,088,609 B2 | 8/2006 | Valet | |
| 7,126,202 B2 | 10/2006 | Huai et al. | |
| 7,211,874 B2 | 5/2007 | Guo et al. | |
| 7,224,601 B2 | 5/2007 | Panchula | |
| 7,230,844 B2 | 6/2007 | Deak | |
| 7,257,021 B2 | 8/2007 | Lienau et al. | |
| 7,282,755 B2 | 10/2007 | Pakala et al. | |
| 7,307,876 B2 | 12/2007 | Kent et al. | |
| 7,310,265 B2 | 12/2007 | Zheng et al. | |
| 7,339,819 B2 | 3/2008 | Johnson | |
| 7,369,427 B2 | 5/2008 | Diao et al. | |
| 7,372,722 B2 | 5/2008 | Jeong et al. | |
| 7,430,135 B2 | 9/2008 | Huai et al. | |
| 7,433,161 B2 | 10/2008 | Ikarashi et al. | |
| 7,846,642 B2 * | 12/2010 | Ofir et al. | 430/311 |

(Continued)

FOREIGN PATENT DOCUMENTS

| | | |
|---|---|---|
| WO | 2004013861 | 2/2004 |
| WO | 2008010957 | 1/2008 |

*Primary Examiner* — Gene Auduong
(74) *Attorney, Agent, or Firm* — Fletcher Yoder

(57) ABSTRACT

Spin current generators and systems and methods for employing spin current generators. A spin current generator may be configured to generate a spin current polarized in one direction, or a spin current selectively polarized in two directions. The spin current generator may by employed in spintronics applications, wherein a spin current is desired.

23 Claims, 3 Drawing Sheets

U.S. PATENT DOCUMENTS

| | | |
|---|---|---|
| 8,228,717 B2 * | 7/2012 | Liu et al. .................. 365/158 |
| 2003/0007398 A1 | 1/2003 | Daughton et al. |
| 2003/0059588 A1 | 3/2003 | Hannah et al. |
| 2005/0099724 A1 | 5/2005 | Nakamura et al. |
| 2006/0262594 A1 | 11/2006 | Fukumoto |
| 2008/0049488 A1 | 2/2008 | Rizzo |
| 2008/0225585 A1 | 9/2008 | Ranjan et al. |

* cited by examiner

SPIN CURRENT GENERATOR FOR STT-MRAM OR OTHER SPINTRONICS APPLICATIONS

CROSS-REFERENCE TO RELATED APPLICATION

This application is a continuation of U.S. patent application Ser. No. 13/012,661, which was filed on Jan. 24, 2011, now U.S. Pat. No. 8,228,717, which issued on Jul. 24, 2012, which is a continuation of U.S. patent application Ser. No. 12/242,228, which was filed on Sep. 30, 2008, now U.S. Pat. No. 7,876,603, which issued on Jan. 25, 2011.

BACKGROUND

1. Field of Invention

The invention relates generally to current generators, and more particularly, to spin current generators for spintronics applications.

2. Description of Related Art

This section is intended to introduce the reader to various aspects of the art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

The development of microelectronics has led to large increases in integration density and efficiency. However, the conventional electronic methods of operation by applying voltage to control electron charge are fundamentally limited.

Further improvements in nonvolatility, speed, and size of electronic devices may require advancements in new technology. Spintronics, or spin electronics (also known as spin transport electronics and magnetoelectronics), refers to the study of the spin of an electron in solid state physics and the possible devices that may advantageously use electron spin properties instead of, or in addition to, the conventional use of electron charge.

The spin of an electron has two states and is characterized as being either "spin up" or "spin down." Conventional spintronics devices have relied on systems that provide bidirectional current to alter the electron spins in the device. For example, one spintronics application involves data storage through a spintronics effect known as giant magnetoresistance (GMR). The GMR structure includes alternating ferromagnetic and nonmagnetic metal layers, and the magnetizations and electron spins in each of these magnetic layers provide resistance changes through the layers. The resistance of the GMR may change from low (if the magnetizations are parallel) to high (if the magnetizations are antiparallel), and the inducing and detecting of such magnetoresistance changes are the basis for writing and reading data. Another example of spintronics devices includes spin torque transfer magnetic random access memory (STT-MRAM). STT-MRAM also exploits electron spin polarity by utilizing the electron spin to switch the magnetization of ferromagnetic layers to provide two programmable states of low and high resistance.

This alteration of magnetization typically employs a bidirectional programming current to change the magnetizations of the layers in a memory cell. However, bidirectional programming logic requires more cell space. A transistor select device is required for each memory cell, and this also increases the cell area. Furthermore, bidirectional programming logic is generally more complicated and less efficient than unidirectional programming logic.

BRIEF DESCRIPTION OF DRAWINGS

Certain embodiments are described in the following detailed description and in reference to the drawings in which.

DETAILED DESCRIPTION

Spintronics devices write and store information by manipulating electron spin in a particular orientation. As previously discussed, information may be stored by programming magnetic layers in a memory cell into low resistance and high resistance states. Switching between the two resistance states typically employs a bidirectional programming current, where a current passed in one direction may orient the magnetization of memory cell layers to a low resistance state, and a current passed in an opposite direction may orient the magnetization of memory cell layers to a high resistance state. Since bidirectional programming logic requires more complicated circuitry and more chip space, a method of generating electron currents with desired spin polarizations may reduce the complexity and size of memory cell area or other devices requiring currents of different polarities by facilitating unidirectional programming. The following discussion describes the systems and devices, and the operation of such systems and devices in accordance with the embodiments of the present technique.

Figure 1:
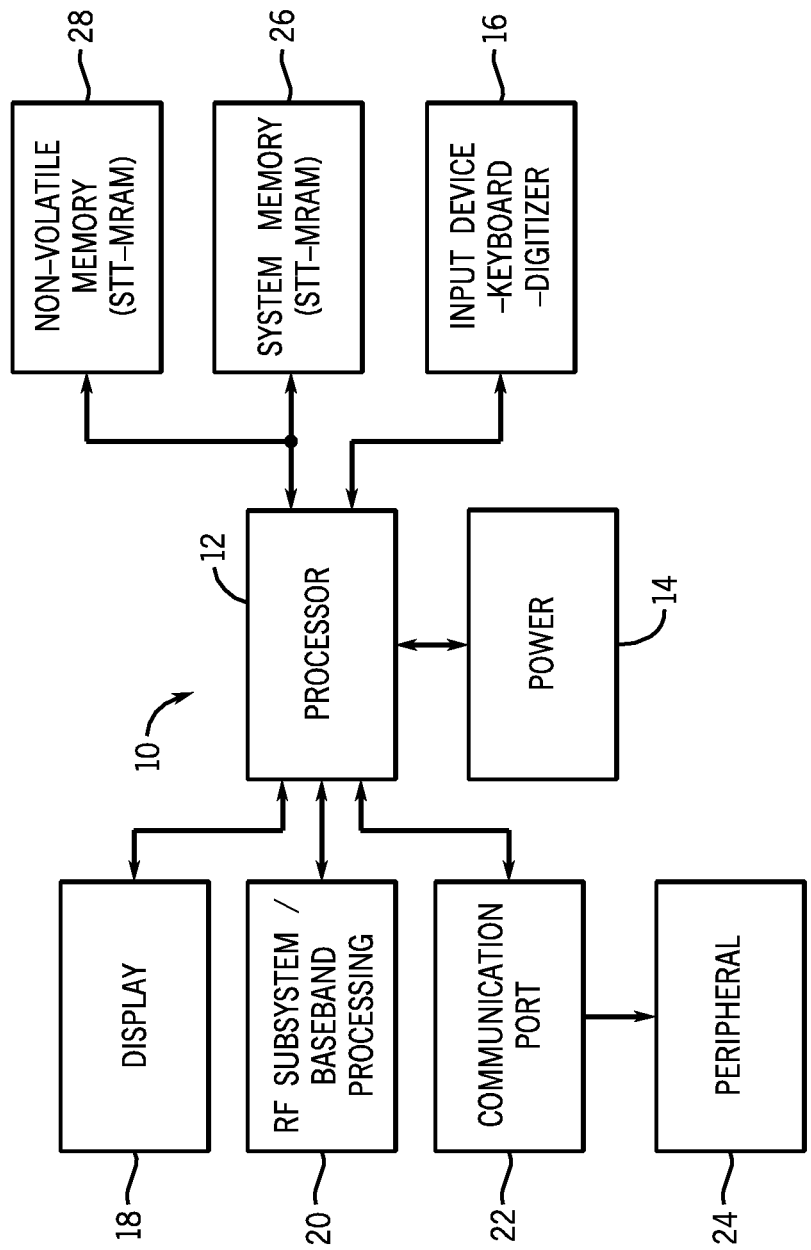
FIG. 1 depicts a block diagram of a processor-based system in accordance with an embodiment of the present technique.

FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include spin torque transfer magnetic random access memory (STT-MRAM), magnetic random access memory (MRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include STT-MRAM devices, such as those discussed further below.

The processor 12 may also be coupled to non-volatile memory 28, which is not to suggest that system memory 26 is necessarily volatile. The non-volatile memory 28 may include STT-MRAM, MRAM, read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include STT-MRAM devices manufactured in accordance with embodiments of the present technique.

Both the system memory 26 and the non-volatile memory 28 may include memory cells programmable by manipulation of electron spin or other spintronics components. For example, the memory cells may include MRAM cells, STT-MRAM cells, or memory cells that utilize the giant magnetoresistive (GMR) effect. The system memory 26 and the non-volatile memory 28 may further include a spin current generator to generate single-spin polarity current (i.e., a current that can be generated with a spin polarity in only one direction), bi-spin polarity current (i.e., a current that can be generated with a spin polarity in either direction), non-polarized current or arbitrary spin-polarized current to program the memory cells, as will be further described below.

Figure 2:
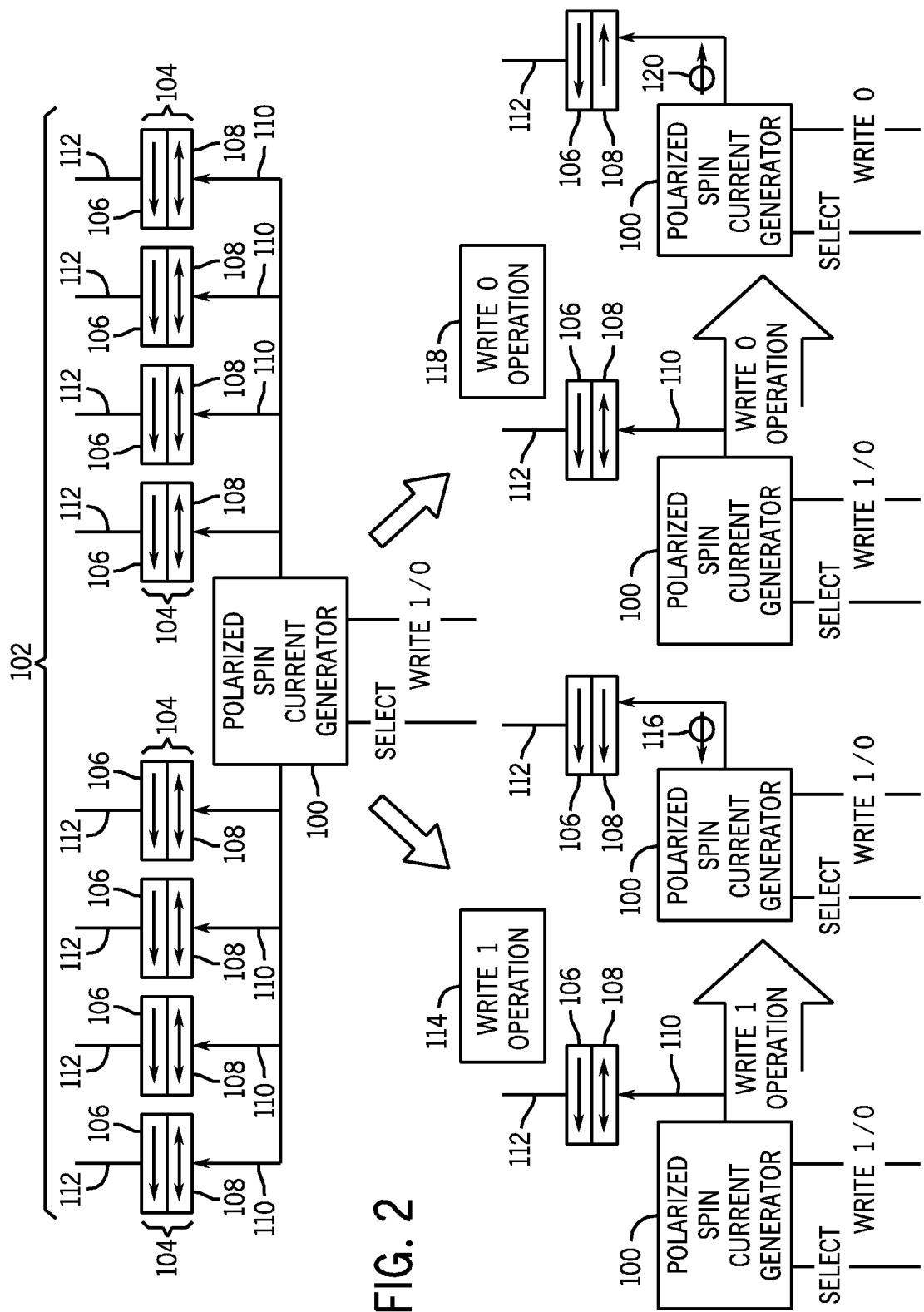
FIG. 2 depicts a device architecture and method by which a spin current generator may enable a spintronics device in accordance with embodiments of the present technique.

FIG. 2 depicts an example of a portion of a spintronics device and a method by which a spin current generator 100 may be used to program the device in accordance with embodiments of the present technique. The portion of the spintronics device illustrated here includes an array 102 of memory cell components 104 with magnetic layers 106 and 108. As will be appreciated, each memory cell component 104 may form the memory portion of a single memory cell in the array 102. The memory cell components 104 may include magnetic tunnel junctions (MTJs), stacks of ferromagnetic and nonmagnetic layers, or any other structure in which magnetization may be manipulated to alter the structure's magnetoresistance state. Furthermore, the memory cell components 104 may be components of magnetic random access memory (MRAM) cells, spin torque transfer magnetic random access memory (STT-MRAM) cells, or any other device exploiting the manipulation of electron spin to program the cell.

In this example, the memory cell component 104 includes a pinned layer 106 and a free layer 108. A memory cell may be "written" or "programmed" by switching the magnetization of the free layer 108 in the memory cell component 104, and the cell may be read by determining the resistance across the free layer 108 and the pinned layer 106. The layers 108 and 106 may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as $Fe_3O_4$, $CrO_2$, NiMnSb and PtMnSb, and BiFeO, for instance. The pinned layer 106 is so named because it has a magnetization with a fixed or pinned preferred orientation, and this is represented by the unidirectional arrow illustrated in the pinned layer 106. An additional layer of antiferromagnetic material may be deposited below the pinned ferromagnetic layer to achieve the pinning through exchange coupling. The bidirectional arrow illustrated in the free layer 108 represents that the free layer 108 may be magnetized either in a direction parallel to the pinned layer 106, which gives a low resistance, or in a direction antiparallel to the pinned layer 106, which gives a high resistance. The memory cell component 104 may also include a nonmagnetic layer between the free layer 108 and the pinned layer 106 to serve as an insulator between the two layers 108 and 106, thereby forming a MTJ structure in this example. The nonmagnetic layer may include materials such as $AlxOy$, $MgO$, $AN$, $SiN$, $CaOx$, $NiOx$, $HfO2$, $Ta2O5$, $ZrO2$, $NiMnOx$, $MgF2$, $SiC$, $SiO2$, $SiOxNy$, for example.

The spin current generator 100 is connected to each memory cell in the array 102 through source lines 110. In the presently illustrated embodiment, each of the memory cell components 104 is coupled in series to form a string, such that each of the memory cell components 104 is coupled to a common source line 110. When a memory cell is selected to be programmed, the spin current generator 100 sends a spin polarized current through the source line 110 to the selected memory cell and memory cell component 104. If the memory cell is to be programmed to a low resistance state ("write 1 operation") 114, the spin current generator 100 will generate a current polarized in one direction (e.g., to the left) 116, and the left-polarized current will switch the magnetization of the free layer 108 to the left. Because the magnetization of the pinned layer 106 is also directed to the left, the magnetizations of the free layer 108 and the pinned layer 106 are parallel, and the memory cell is programmed to a low resistance state. Likewise, if the memory cell is to be programmed to a high resistance state ("write 0 operation") 118, the spin current generator 100 will generate a current polarized in an opposite direction (to the right) 120, and the right-polarized current will switch the magnetization of the free layer 108 to the right. Because the magnetization of the pinned layer 106 is directed to the left, the magnetizations of the free layer 108 and the pinned layer 106 are antiparallel, and the memory cell is programmed to a high resistance state.

The method depicted in accordance with embodiments of the present technique thus enables the memory cells or other spintronics devices to be programmed by a unidirectional current, allowing for simpler unidirectional programming logic. As previously discussed, conventional spintronics devices, including STT-MRAM devices, typically use bidirectional programming logic, meaning the write current is driven in opposite directions through a device cell stack to switch the cell between different programmable states. For example, in a STT-MRAM cell, a write current may be driven from a transistor source to a transistor drain, and then through a MTJ to program the memory cell to a high resistant state. To program a memory cell to a low resistance state, a write current may be driven from a MTJ to a transistor drain to a transistor source. Unidirectional programming logic may be simpler and more efficient than bidirectional programming logic. Also, the array 102 may be fabricated without a separate transistor for each cell, which further decreases cell size and cost. By utilizing a spin current generator 100 which may generate a spin current polarized in either direction (a bi-spin polarity current), the memory cell component 104 may be programmed with a unidirectional current, as described further below. Further, in certain embodiments, a single-spin polarity current, or a non-polarized spin current may be utilized to program a memory cell component 104, by adding certain features or layers to the memory cell component 104, such that the memory cell component 104 is able to exploit the properties of the current to facilitate the changing of the magnetization of a free ferromagnetic layer, therein. For example, in FIG. 2, if a non-polarized current is passed through the memory cell component 104, the pinned layer 106 may reflect the current towards the free layer 108 and switch the magnetization direction of the free layer 108 to the opposite direction of the pinned layer 106.

Figure 3:
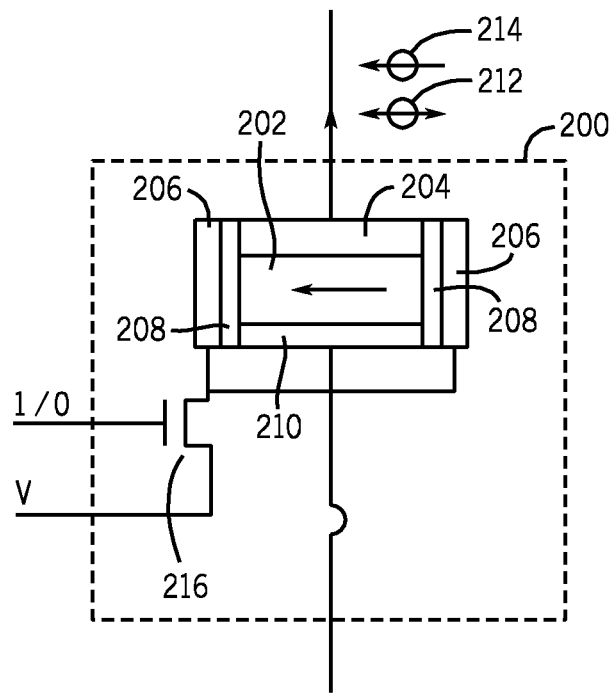
FIG. 3 depicts a spin current generator capable of generating non-polarized or adjustably polarized current in accordance with embodiments of the present invention.

One embodiment of the present invention, a spin current generator configured to generate a unidirectional current to adjust polarization direction in a spintronics device, is illustrated in FIG. 3, where a spin current generator 200 can generate a non-polarized current 212 or a single-spin polarized current 214. The bidirectional arrows depicting the non-polarized current 212 represent that the current is not yet polarized in any direction. Conversely, the unidirectional arrow depicting the polarized current 214 represent that the current is polarized in one direction (single-spin polarized). The spin current generator 200 includes a spin-polarizing layer 202, which may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The spin current generator 200 may also include a nonmagnetic layer 204 which may be nonconductive and include some combination of AlxOy, MgO, AN, SiN, CaOx, NiOx, HfO2, Ta2O5, ZrO2, NiMnOx, MgF2, SiC, SiO2, or SiOxNy, for example, or conductive and include some combination of Cu, Au, Ta, Ag, CuPt, CuMn or other nonmagnetic transition metal, for example. The spin-polarizing layer 202 and the nonmagnetic layer 204 may be isolated from a material 206 by an insulative material 208. In some embodiments, the material 206 may generate heat ("heater material"), and in other embodiments, the material 206 may comprise piezoelectric materials ("piezoelectric material").

In some embodiments, the material 206 may incorporate some combination of heat generating and piezoelectric materials, or the material 206 may comprise more than one heat generating and/or piezoelectric material. As used in the present specification, the term "layer" refers to materials formed in parallel, with one material disposed over another (e.g., layers 204, 202, and 210 of FIG. 3). In contrast other materials, not referred to as layers, may be formed perpendicular to a stack of parallel materials (e.g., layers 206 and 208 are perpendicular to layers 204, 202, and 210 of FIG. 3), as spacers other structures formed adjacent to the layers. As also used herein, it should be understood that when a layer is said to be "formed on" or "disposed on" another layer, the layers are understood to be parallel to one another, but there may be intervening layers formed or disposed between those layers. In contrast, "disposed directly on" or "formed directly on" refers to layers in direct contact with one another. Similarly, if materials are said to be "adjacent" to other materials, the materials are in the same cross-sectional plane (e.g., the layer 206 is adjacent to the layers 202, 204 and 210). Further, if a material is said to be adjacent to another material or layer, there may be intervening materials therebetween, while "directly adjacent," connotes no intervening materials therebetween.

Since heat decreases magnetization and spin-polarization efficiency in magnetic materials, a heater material 206 may apply heat to decrease or eliminate the magnetization or spin polarization of the spin-polarizing layer 202, and the spin current generator 200 may output a non-polarized or less spin polarized current 212. Specifically, when voltage is applied to the spin current generator 200 through the transistor 216, the heater material 206 may heat up the spin-polarizing layer close to or above its curie temperature, which may be in a range of approximately 160° C. to 300° C. The spin-polarizing layer 202 would then substantially lose its magnetization, and current would be non-polarized or not highly polarized after it passes through the demagnetized spin-polarizing layer 202. The spin-polarizing layer 202 may retain its magnetization through an exchange interaction with the antiferromagnetic layer 210 when the spin-polarizing layer 202 is cooled to approximately room temperature. Thus, the spin current generator 200 may produce a unidirectional non-polarized current to program a spintronics device. One example of how a unidirectional non-polarized current may program a spintronics device is to pass non-polarized current that becomes spin polarized by magnetic layers of fixed magnetization in a spintronics device. Further, magnetic layers may be switched by reflected currents polarized by other layers in a spintronics device.

Alternatively, the spin current generator 200 may produce polarized current 214 of various polarization degrees through a transient stress effect induced by the piezoelectric stress material 206. The piezoelectric stress material 206 may apply varying stress to adjust the spin polarization of the spin-polarizing layer 202. When voltage is applied to the piezoelectric stress material 206 through the transistor 216, the piezoelectric stress material 206 may induce a stress that modulates the spin-polarization efficiency of the spin-polarizing layer 202 such that the current output of the spin current generator 200 may be polarized to a desired degree.

Specifically, the spin polarization degree of the output current is determined by the spin-polarization efficiency of the spin-polarizing layer 202, which may be adjusted by either heat or stress to the spin-polarizing layer 202. If the spin current generator 200 sends a polarized current 214 to a spintronics device, voltage may be applied to the spin current generator 200, and the piezoelectric material 206 may generate a transient stress in the spin-polarizing layer 202. The transient stress influences the spin-polarization efficiency of the spin-polarizing layer 202, which affects the degree of polarization of the output current. Thus, embodiments in accordance with the present technique may produce unidirectional single-spin polarized current to switch the magnetization of a spintronics device. The direction of the spin current that may be output by the spin current generator 200 is dependent on the arrangement of the transistor 216, as will be appreciated.

The heater material 206 may comprise refractory metals including, for example, nitride, carbide, and Boride, TiN, ZrN, HfN, VN, NbN, TaN, TiC, ZrC, HfC, VC, NbC, TaC, TiB2, ZrB2, HfB2, VB2, NbB2, TaB2, Cr3C2, Mo2C, WC, CrB2, Mo2B5, W2B5, or compounds such as TiAlN, TiSiN, TiW, TaSiN, TiCN, SiC, B4C, WSix, MoSi2, or elemental materials such as doped silicon, carbon, Pt, Niobium, Tungsten, molybdenum, or metal alloys such as NiCr, for example. In some embodiments, the piezoelectric material 206 may be composed of a conductive piezoelectric material, such as (TaSe4)2I, multi-layered $Al_xGa1-xAs/GaAs$, $BaTiO3/$VGCF/CPE composites, or other piezoelectric/conductive material composites. In other embodiments, the piezoelectric material 206 may be an insulative material, such as berlinite ($AlPO_4$), quartz, gallium orthophosphate ($GaPO_4$), langasite ($La_3Ga_5SiO_{14}$), ceramics with perovskite or tungsten-bronze structures such as barium titanate ($BaTiO_3$), SrTiO3, bismuth ferrite ($BiFeO_3$), lead zirconate titanate ($Pb[Zr_xTi_{1-x}]O_3$ 0<x<1), $Pb_2KNb_5O_{15}$, lead titanate ($PbTiO_3$), lithium tantalate ($LiTaO_3$), sodium tungstate ($Na_xWO_3$), potassium niobate ($KNbO_3$), lithium niobate ($LiNbO_3$), $Ba_2NaNb_5O_5$, and other materials such as ZnO, AlN, polyvinylidene fluoride (PVDF), lanthanum gallium silicate, potassium sodium tartrate, sodium potassium niobate (KNN). The nonmagnetic layer 204 may insulate the magnetic layers of the spin current generator 200 from other magnetic layers and may be either conductive or nonconductive. The conductive nonmagnetic layer 204 may comprise Cu, Au, Ta, Ag, CuPt, CuMn, or other nonmagnetic transition metals, or any combination of the above nonmagnetic conductive materials. The nonconductive nonmagnetic layer 204 may comprise $Al_xO_y$, MgO, AlN, SiN, $CaO_x$, $NiO_x$, $HfO_2$, $Ta_2O_5$, $ZrO_2$, $NiMnO_x$, $MgF_2$, SiC, $SiO_2$, $SiO_xN_y$, or any combination of the above nonmagnetic nonconductive materials.

Figure 4:
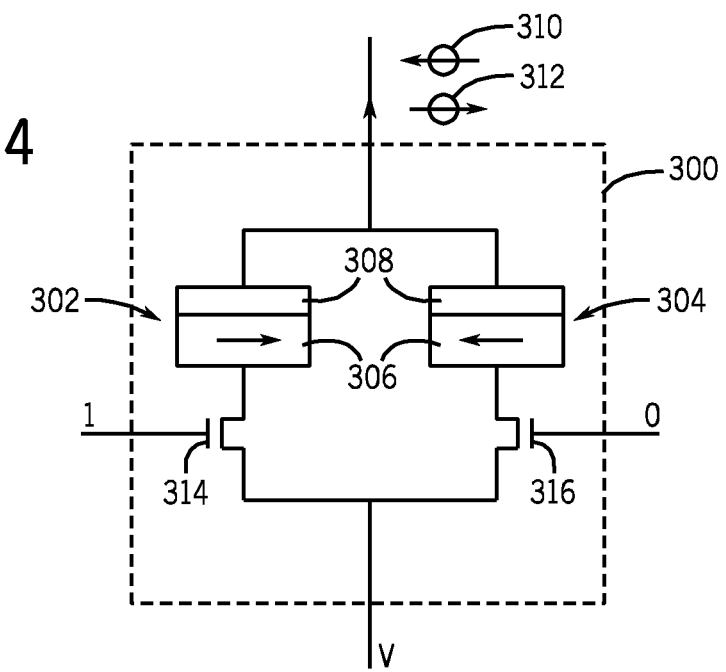
FIG. 4 depicts a spin current generator capable of generating adjustably polarized current in accordance with embodiments of the present invention.

Another embodiment of the present invention is illustrated in FIG. 4, where a spin current generator 300 can generate arbitrary spin current or spin current polarized in either direction (bi-spin polarity). As used in the present specification, arbitrary spin current refers to spin current polarized in either direction with any desired polarization degree. The spin current generator 300 uses two structures 302 and 304 of opposite magnetization. Each structure has a respective spin polarizing layer 306 and a nonmagnetic layer 308. The spin-polarizing layer 306 in the structures 302 and 304 have opposite magnetizations, and this enables the spin current generator 300 to generate current spin-polarized in an arbitrary degree for a spintronics device, or in a specified direction based on the selection of the appropriate transistor 314 or 316. The spin current generator 300 may be employed in applications and systems benefiting from a spin current generator capable of producing a bi-spin polarity current (i.e., a current with a spin-polarity in either direction), such as the memory cells of FIG. 1.

For example, if a memory cell (as in FIG. 2) is selected to be programmed to a low resistance state, a current would pass through the structure 304 of the spin current generator 300, via the transistor 316, where the spin-polarizing layer 306 polarizes the spin of the electrons to the left. The spin current generator 300 then outputs a programming current spin polarized to the left 310, and the left-polarized current 310 switches the magnetization of free layer 108 (of FIG. 2) to the left, parallel to the pinned layer 106, writing the cell in a low resistance state. If a memory cell is selected to be programmed to a high resistance state, a current would pass through the structure 302 of the spin current generator 300, via the transistor 314, where the spin-polarizing layer 306 polarizes the spin of the electrons to the right. The programming current is spin polarized to the right 312, and the right-polarized current 312 switches the magnetization of free layer 108 to the right, antiparallel to the pinned layer 106, writing the cell in a high resistance state.

The spin-polarizing layer 306 may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The nonmagnetic layer 308 may insulate the magnetic layers of the spin current generator 300 from other magnetic layers and may be either conductive or nonconductive. The conductive nonmagnetic layer 308 may comprise Cu, Au, Ta, Ag, CuPt, CuMn, or other nonmagnetic transition metals, or any combination of the above nonmagnetic conductive materials. The nonconductive nonmagnetic layer 308 may comprise $Al_xO_y$, MgO, AlN, SiN, $CaO_x$, $NiO_x$, $HfO_2$, $Ta_2O_5$, $ZrO_2$, $NiMnO_x$, $MgF_2$, SiC, $SiO_2$, $SiO_xN_y$, or any combination of the above nonmagnetic nonconductive materials.

This embodiment and other embodiments in accordance with the present technique may be used in spintronics applications, or in conjunction with or incorporated in any device using electron spin properties. As an example, STT-MRAM cells are programmed into low or high resistance states by switching the magnetization of a free ferromagnetic layer in the memory cell. As previously discussed, the memory cell is programmed to a low resistance state when a programming current switches the magnetization of the free layer to be parallel with the magnetization of a pinned layer in the STT-MRAM cell. The memory cell is programmed to a high resistance state when a programming current switches the magnetization of the free layer to be antiparallel with the magnetization of the pinned layer in the STT-MRAM cell. The typical STT-MRAM cell is structured with bidirectional programming logic, as the free layer requires programming current polarized in both directions, depending on the resistance state it will be switched to. In the embodiments of the present technique, a spin current generator capable of generating current polarized in either direction, or not polarized at all, may allow for simpler unidirectional programming logic in the STT-MRAM cell or other spintronics components.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:
1. A device comprising:
   a spin-polarizing layer configured to polarize a programming current such that the programming current is polarized in a first direction; and
   a non-magnetic layer disposed directly on a first surface of the spin-polarizing layer; and
   a heater material formed adjacent to the spin-polarizing layer and the nonmagnetic layer.

2. The device, as set forth in claim 1, comprising an insulative material adjacent to the spin-polarizing layer and non-magnetic layer.

3. The device, as set forth in claim 1, comprising a piezoelectric material adjacent to the spin-polarizing layer and non-magnetic layer.

4. The device, as set forth in claim 3, wherein the device is configured to produce polarized current of various polarization degrees through a transient stress effect induced by the piezoelectric material.

5. The device, as set forth in claim 1, comprising an antiferromagnetic layer disposed directly on a second surface of the spin-polarizing layer.

6. The device, as set forth in claim 1, wherein the spin-polarizing layer comprises a ferromagnetic material.

7. The device, as set forth in claim 1, wherein the heater material is configured to apply heat to decrease or eliminate the magnetization or spin polarization of the spin-polarizing layer.

8. The device, as set forth in claim 1, comprising a transistor coupled to the device wherein current flows through and controls the polarity of the current that is output by the device.

9. The device, as set forth in claim 1, wherein the device is configured to generate a unidirectional spin current polarized in either direction.

10. A device comprising:
a spin-polarizing layer configured to polarize a programming current such that the programming current is polarized in a first direction; and
a non-magnetic layer disposed directly on a first surface of the spin-polarizing layer; and
a piezoelectric stress material formed adjacent to the spin-polarizing layer and the non-magnetic layer.

11. The device, as set forth in claim 10, comprising a heater material formed adjacent to the spin-polarizing layer and the nonmagnetic layer.

12. The device, as set forth in claim 10, comprising an antiferromagnetic layer disposed directly on a second surface of the spin-polarizing layer.

13. The device, as set forth in claim 10, wherein the spin-polarizing layer comprises a ferromagnetic material.

14. The device, as set forth in claim 10, wherein the device is configured to produce polarized current of various polarization degrees through a transient stress effect induced by the piezoelectric stress material.

15. The device, as set forth in claim 10, comprising a transistor coupled to the device wherein current flows through and controls the polarity of the current that is output by the device.

16. The device, as set forth in claim 10, wherein the device is configured to generate a unidirectional spin current polarized in either direction.

17. A device comprising:
an array of memory cells;
a structure configured to generate a unidirectional spin current to the array of memory cells; and
wherein the structure is configured to generate a unidirectional non-spin polarized current and the structure comprises a spin-polarizing layer and a heater material that decreases or eliminates a spin polarization of the spin-polarizing layer.

18. The device, as set forth in claim 17, wherein each of the memory cells in the array of memory cells are coupled to each other and the structure by source lines, and the structure is configured to send a current through the source line to each of the memory cells.

19. The device, as set forth in claim 17, wherein each of the memory cells in the array of memory cells comprises a spin torque transfer magnetic random access memory cell having a pinned layer configured to a fixed magnetization in one direction and a free layer configured to be magnetized in either direction.

20. The device, as set forth in claim 19, wherein the pinned and free layers comprise ferromagnetic materials.

21. The device, as set forth in claim 19, comprising an antiferromagnetic material deposited below the pinned layer.

22. The device, as set forth in claim 19, comprising a nonmagnetic layer deposited between the free layer and the pinned layer.

23. The device, as set forth in claim 19, wherein the device is configured to output a current with a polarity in one direction to set the magnetization of the free layer to that direction and program the memory cell in a first state, and to output a current with a polarity in a different direction to set the magnetization of the free layer to that direction and program the memory cell in a second state.

* * * * *